United States Patent
Kim et al.

(10) Patent No.: US 9,911,760 B2
(45) Date of Patent: Mar. 6, 2018

(54) THIN FILM TRANSISTOR SUBSTRATE AND MANUFACTURING METHOD THEREOF

(71) Applicant: LG DISPLAY CO., LTD., Seoul (KR)

(72) Inventors: Kangil Kim, Paju-si (KR); Haye Kim, Goyang-si (KR); Chansoo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/265,010

(22) Filed: Sep. 14, 2016

(65) Prior Publication Data

US 2017/0084631 A1    Mar. 23, 2017

(30) Foreign Application Priority Data

Sep. 17, 2015    (KR) .......................... 10-2015-0131420

(51) Int. Cl.
*H01L 27/02* (2006.01)
*H01L 27/12* (2006.01)

(52) U.S. Cl.
CPC ........ *H01L 27/124* (2013.01); *H01L 27/1248* (2013.01)

(58) Field of Classification Search
CPC .......................... H01L 27/124; H01L 27/1262
See application file for complete search history.

(56) References Cited

U.S. PATENT DOCUMENTS

| | | | |
|---|---|---|---|
| 2003/0085406 A1* | 5/2003 | Cheng | G02F 1/134363 257/72 |
| 2011/0273648 A1* | 11/2011 | Lee | G02F 1/134363 349/106 |
| 2015/0123113 A1* | 5/2015 | Park | H01L 27/1244 257/43 |

* cited by examiner

*Primary Examiner* — Kimberly Rizkallah
*Assistant Examiner* — Maria Ligai
(74) *Attorney, Agent, or Firm* — Dentons US LLP

(57) ABSTRACT

A thin film transistor substrate including a second electrode connected to a first electrode within a shared contact hole; and a fourth electrode connected to a third electrode within the shared contact hole, wherein the shared contact hole penetrates through a plurality of stacked insulating layers, and wherein an insulating layer below at least one of a connection portion in which the first electrode and the second electrode are connected and a connection portion in which the third electrode and the fourth electrode are connected has an undercut structure within the shared contact hole.

7 Claims, 18 Drawing Sheets

THIN FILM TRANSISTOR SUBSTRATE AND MANUFACTURING METHOD THEREOF

This application claims the priority benefit of Korean Patent Application No. 10-2015-0131420 filed on Sep. 17, 2015 which is incorporated herein by reference for all purposes as if fully set forth herein.

BACKGROUND

Field

The present disclosure relates to a display device and a manufacturing method thereof, and more particularly, to a thin film transistor substrate having a high aspect ratio and a manufacturing method thereof.

Description of Related Art

Liquid crystal displays (LCD) display an image by adjusting light transmittance of liquid crystal using an electric field. LCDs are classified as a vertical alignment (VA) LCD and an in-plane switching (IPS) LCD according to directions of an electric field driving liquid crystal.

In the VA LCD, a common electrode formed on an upper substrate and a pixel electrode formed on a lower substrate are disposed to face each other and twisted nematic (TN) mode liquid crystal is driven by a vertical field formed therebetween. The VA LCD advantageously has a large aperture ratio but disadvantageously has a narrow viewing angle of about 90 degrees.

In the IPS LCD, liquid crystal is driven in an IPS mode by an in-plane field between a pixel electrode and a common electrode disposed to be parallel each other on a lower substrate. The IPS LCD advantageously has a wide viewing angle, but disadvantageously has an aperture ratio smaller than that of the VA LCD.

FIG. 1 is a plan view illustrating a structure of a TFT substrate according to a related art. FIG. 2 is a cross-sectional view of the TFT substrate illustrated in FIG. 1, taken along line I-I'.

Referring to FIGS. 1 and 2, the related art TFT substrate includes a gate line GL and a data line DL intersecting with each other on a transparent lower substrate SUB. The gate line GL and the data line DL intersecting with each other with a gate insulating layer GI interposed therebetween define a pixel region in a matrix arrangement. On one side of the pixel region, there is disposed a TFT T including a gate electrode G branched from the gate line GL, a source electrode S branched from the data line DL, and a drain electrode D disposed to be spaced apart from the source electrode S by a predetermined interval and facing the source electrode D.

A semiconductor layer A overlapping the gate electrode G is formed on the gate insulating layer GI covering the gate electrode G. One side of the semiconductor layer A is in contact with the source electrode S, and the other side thereof is in contact with the drain electrode D.

A first insulating layer PAS for protecting an element and a second insulating layer PAC for planarization are sequentially formed on the TFT T. A pixel electrode PXL and a common electrode COM formed of a conductive material are formed on the second insulating layer PAC.

The pixel electrode PXL is in contact with the drain electrode D via a pixel contact hole PH penetrating through the second insulating layer PAC. Also, the pixel electrode PXL has a structure of the teeth of a comb in which a plurality of line segment shapes are arranged to be parallel at a predetermined interval within the pixel region.

The common electrode COM is connected to a common line CL disposed to be parallel to the gate line GL. The common line CL is formed on the same layer on which the gate line GL is formed and formed of the same material as that of the gate line GL. The common electrode COM is connected to the common line CL via a common contact hole CH penetrating through the first insulating layer PAS, the second insulating layer PAC, and the gate insulating layer GI.

An in-plane field horizontal in a direction of a surface of the lower substrate SUB is formed between the pixel electrode PXL and the common electrode COM to drive a liquid crystal layer disposed on the lower substrate SUB. A portion of the pixel electrode PXL is disposed to overlap the common line CL with the gate insulating layer GI, the first insulating layer PAS, and/or the second insulating layer PAC interposed therebetween. a Storage capacitor is formed in the overlap region.

In order to electrically connect lines and/or electrodes formed on mutually different layers and apply the same signal, a contact hole penetrating through the insulating layer interposed between the electrodes is formed. That is, as mentioned above, a pixel contact hole PH is formed to electrically connect the pixel electrode PXL and the drain electrode D, and a common contact hole CH is formed to electrically connect the common electrode COM and the common line CL.

Each of the contact holes PH and CH may need to be designed to have a sufficient area in order to reduce or prevent defective contact of the lines and/or the electrodes D, PXL, CL, and COM which are to be electrically connected. As the insulating layers PAS, PAC, and GI are thicker, the area of the contact holes PH and CH penetrating therethrough is increased. Also, when the plurality of contact holes PH and CH are disposed, a process margin may be required between the contact holes PH and CH.

In order to secure a region in which the contact holes PH and CH are disposed and a process margin region between the contact holes PH and CH, a sufficient space may need to be allocated. Such a space is a non-opening or a non-display area, and thus, may reduce aperture ratio. Also, in order to reduce or prevent generation of light leakage due to steps resulting from the contact holes PH and CH, a black matrix may be disposed in regions corresponding thereto. Here, since the black matrix is also a non-opening, the black matrix may also reduce aperture ratio.

These problems may become more severe in a high pixel-per-inch display device. That is, in a high resolution display device having a high PPI, a size of a single pixel is reduced, and thus, a size of contact holes PH and CH, and the like, may further reduce aperture ratio.

SUMMARY

An aspect of the present disclosure is to provide a display device having a thin film transistor (TFT) with improved aperture ratio, and a manufacturing method thereof.

A thin film transistor substrate including a second electrode connected to a first electrode within a shared contact hole; and a fourth electrode connected to a third electrode within the shared contact hole, wherein the shared contact hole penetrates through a plurality of stacked insulating layers, and wherein an insulating layer below at least one of a connection portion in which the first electrode and the second electrode are connected and a connection portion in which the third electrode and the fourth electrode are connected has an undercut structure within the shared contact hole.

A method for manufacturing a thin film transistor substrate includes forming a gate electrode and a common line on a substrate; forming a gate insulating layer on the gate electrode and the common line; forming a semiconductor layer on the gate electrode and the common line; forming a source electrode in contact with one side of the semiconductor layer and a drain electrode in contact with the other side of the semiconductor layer; forming a first insulating layer and a second insulating layer on the source electrode and the drain electrode; forming a shared contact hole penetrating through the gate insulating layer, the first insulating layer, and the second insulating layer to expose a portion of the common line and a portion of the drain electrode, and generating undercut at one end of the gate insulating layer; and forming a common electrode connected to the common line and a pixel electrode connected to the drain electrode within the shared contact hole by applying a metal material on the second insulating layer and patterning the metal material.

A method for manufacturing a thin film transistor substrate includes a first pixel region having a first thin film transistor (TFT) including a first semiconductor layer, a gate line, a first source electrode, and a first drain electrode and a second pixel region having a second TFT including a second semiconductor layer, the gate line, a second source electrode, and a second drain electrode, the method includes forming the first semiconductor layer having a first channel region and a first source region and a first drain region respectively defined on both sides of the first channel region, and forming the second semiconductor layer having a second channel region and a second source region and a second drain region respectively defined on both sides of second first channel region, on a substrate; sequentially forming a gate insulating layer and a gate line on the first and second semiconductor layers; forming an intermediate insulating layer on the gate line; forming a first source electrode in contact with the first source region via a first source contact hole and a first drain electrode in contact with the first drain region via a first drain contact hole, and forming a second source electrode in contact with the second source region via a second source contact hole and a second drain electrode in contact with the second drain region via a second drain contact hole, on the intermediate insulating layer; forming a first insulating layer on the first and second source electrodes and the first and second drain electrodes; forming a common electrode on the first insulating layer; forming a second insulating layer on the common electrode; forming a shared contact hole penetrating through the intermediate insulating layer, the first insulating layer, and the second insulating layer to expose a portion of the first drain electrode, a portion of the second drain electrode, and a portion of the gate line, and generating undercut at one end of the intermediate insulating layer; and forming a first pixel electrode connected to the first drain electrode and a second pixel electrode connected to the second drain electrode within the shared contact hole by applying a metal material on the second insulating layer and patterning the metal material.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
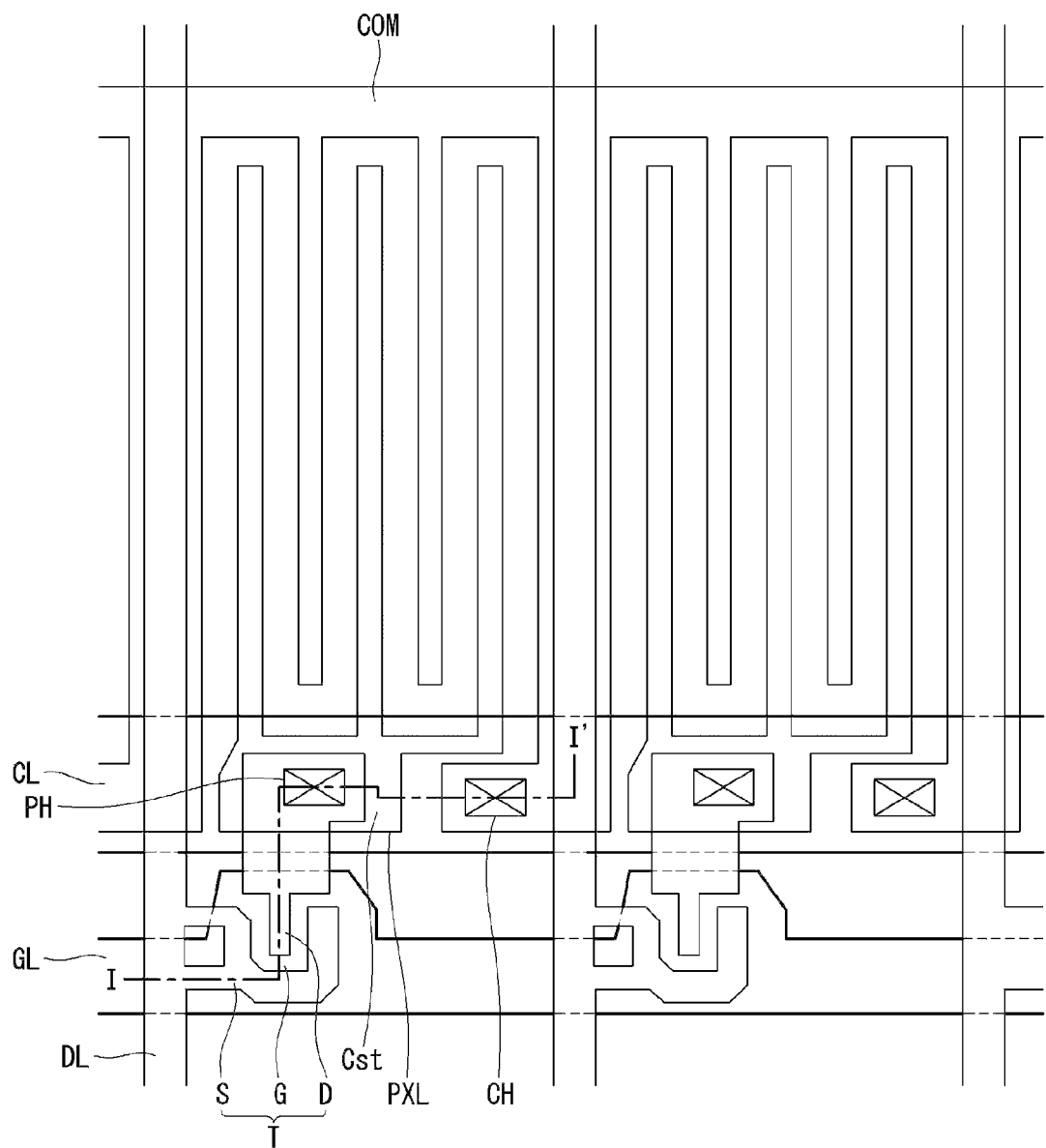
FIG. 1 is a plan view illustrating a structure of a thin film transistor (TFT) substrate according to the related art.
Figure 2:
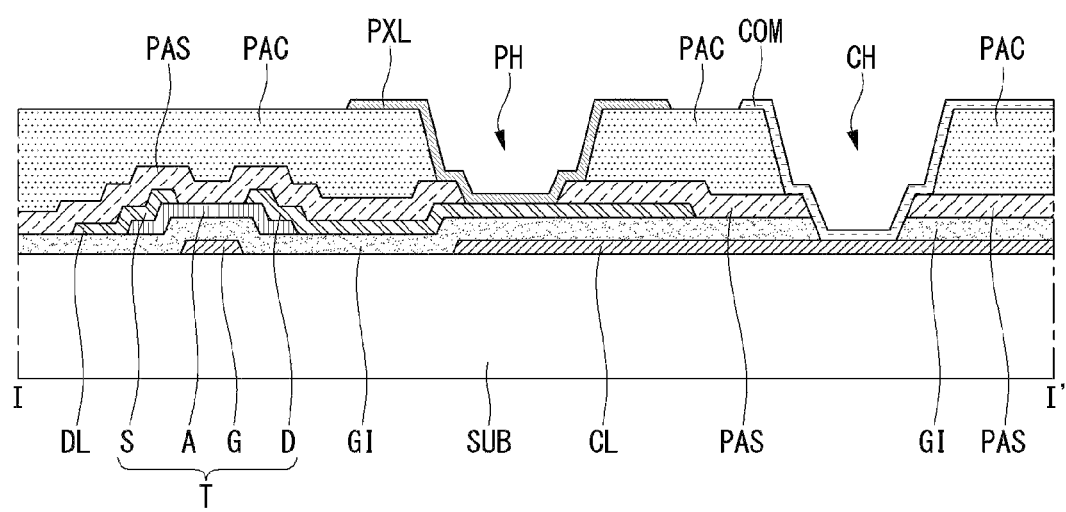
FIG. 2 is a cross-sectional view of the TFT substrate of FIG. 1, taken along line I-I'.

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various embodiments, the same components will be representatively described in a first embodiment and may be omitted in other embodiments.

It will be understood that, although the terms first, second, etc. may be used herein to describe various elements, these elements should not be limited by these terms. These terms are only used to distinguish one element from another.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween.

An aspect of the present invention is directed to reduce the number of contact holes provided to electrically connect electrodes positioned in mutually different layers with one or more insulating layers interposed therebetween.

A thin film transistor (TFT) substrate according to an embodiment of the present disclosure includes a first electrode (or line), a second electrode, a third electrode, and a fourth electrode. Via a shared contact hole, the first and the second electrodes are connected and the third and the fourth electrodes are connected. The shared contact hole penetrates through at least one stacked insulating layer. Within the shared contact hole, an insulating layer positioned below at least one of a connection portion of the first electrode and the second electrode and a connection portion of the third electrode and the fourth electrode has an undercut structure. Here, a first signal is applied to the first electrode and the second electrode in contact with each other, and a second signal is applied to the third electrode and the fourth electrode in contact with each other. The first signal and the second signal are different signals.

In other words, the TFT substrate according to an embodiment of the present disclosure includes the first electrode and the second electrode formed on a layer different from that of the first electrode and electrically connected to the first electrode and includes the third electrode to which a signal different to a signal applied to the first electrode is applied and the fourth electrode formed on a layer different from that of the third electrode and electrically connected to the third electrode. Here, on the TFT substrate according to an embodiment of the present disclosure, through the single shared common contact hole, the first electrode are in contact with each other and the third and fourth electrodes are in contact with each other.

Hereinafter, technical features of the present disclosure will be described through embodiments of the present disclosure. Here, however, features of the present disclosure are not limited to the following embodiments.

First Embodiment

Figure 3:
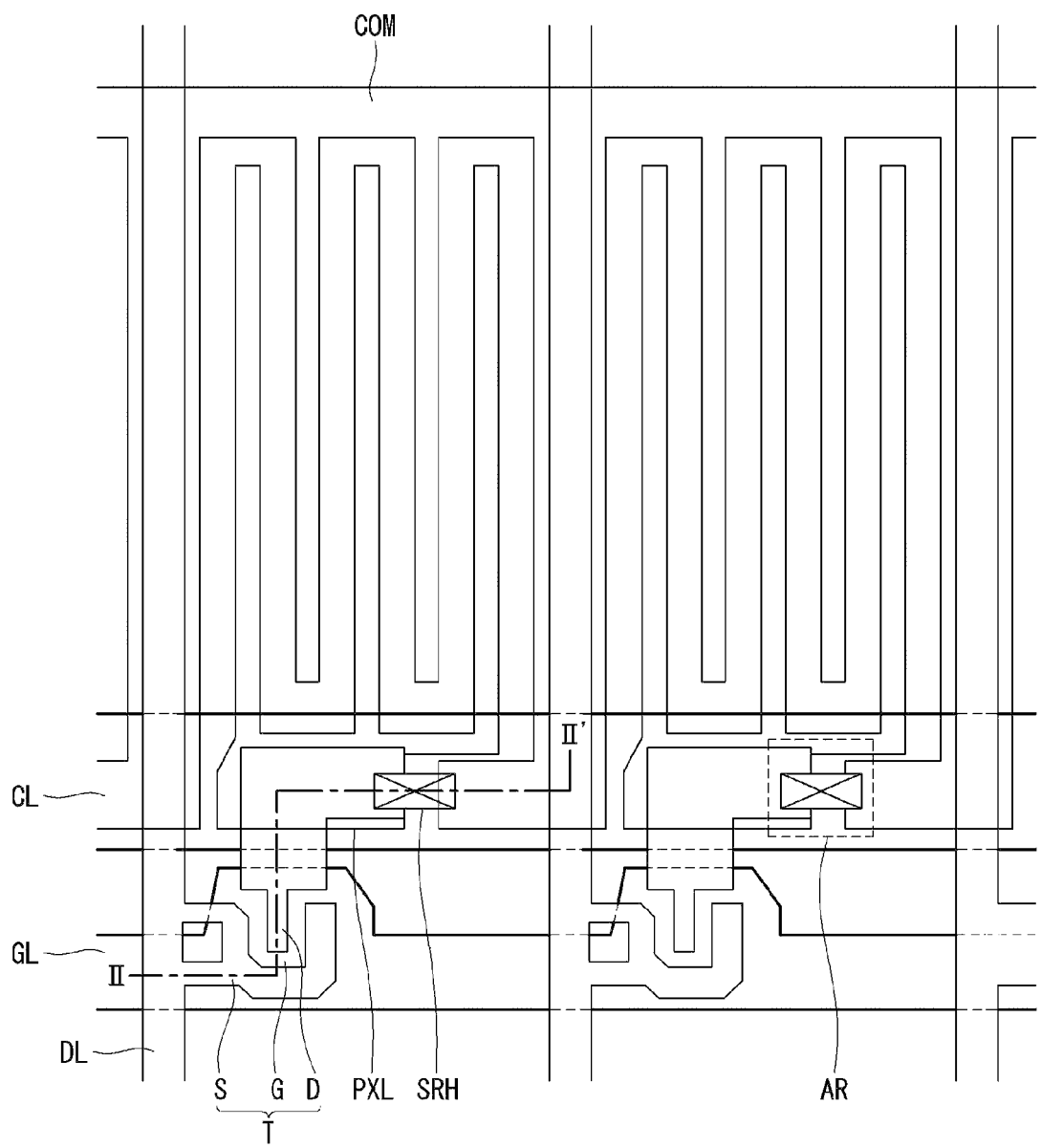
FIG. 3 is a plan view illustrating a structure of a TFT substrate according to a first embodiment of the present disclosure.
Figure 4:
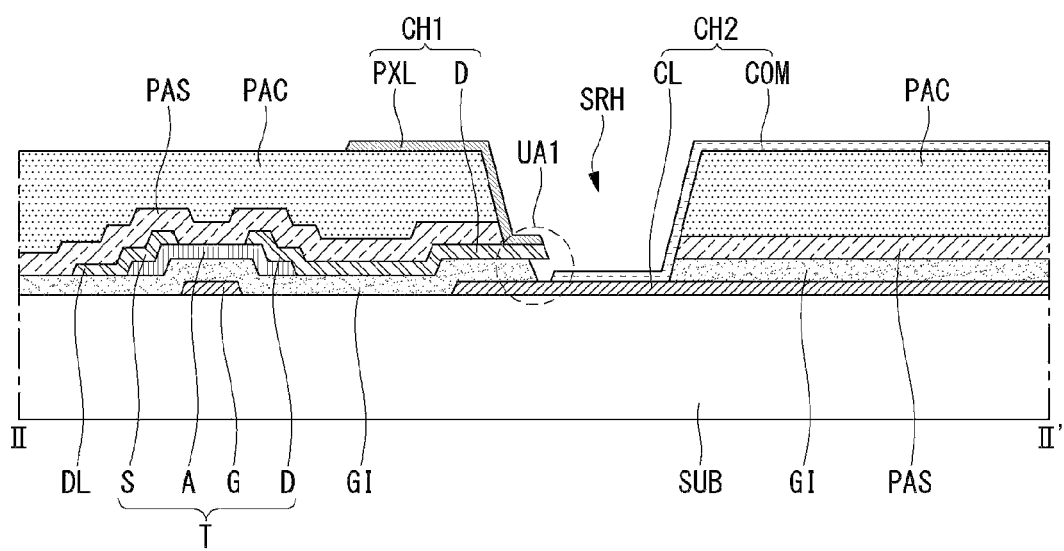
FIG. 4 is a cross-sectional view of the TFT substrate according to the first embodiment of the present disclosure illustrated in FIG. 3, taken along line II-II'.
Figure 5:
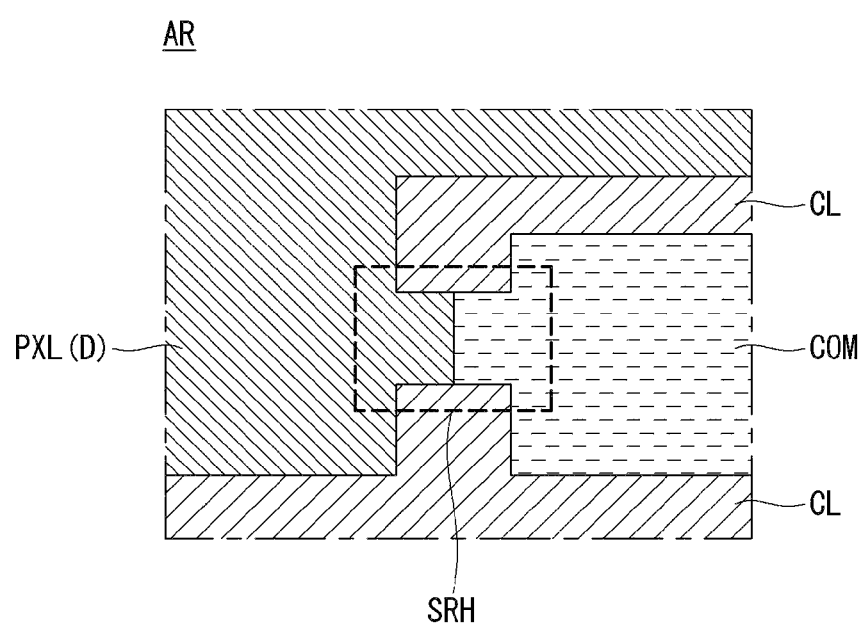
FIG. 5 is an enlarged view of a region "AR" of FIG. 3.

Hereinafter, a TFT substrate according to a first embodiment of the present disclosure will be described with reference to FIGS. 3 to 5. FIG. 3 is a plan view illustrating a structure of a TFT substrate according to a first embodiment of the present disclosure. FIG. 4 is a cross-sectional view of the TFT substrate according to the first embodiment of the present disclosure illustrated in FIG. 3, taken along line II-II'. FIG. 5 is an enlarged view of a region "AR" of FIG. 3.

Referring to FIGS. 3 to 5, the TFT substrate according to the first embodiment of the present disclosure includes a gate line GL and a data line DL intersecting with each other on a lower substrate SUB. The gate line GL and the data line DL intersecting with each other with the gate insulating layer GI interposed therebetween define a pixel region. On one side of the pixel region, there is disposed a TFT T including a gate electrode G branched from the gate line GL, a source electrode S branched from the data line DL, and a drain electrode D disposed to be spaced apart from the source electrode S by a predetermined interval and facing the source electrode D. A structure of the TFT is not limited to the structure illustrated in FIGS. 3 and 4 and the TFT may have various other structures such as a top gate structure, a bottom gate structure, a double gate structure, and the like.

A semiconductor layer A is formed on the gate insulating layer GI covering the gate electrode G and overlaps the gate electrode G. One side of the semiconductor layer A is in contact with the source electrode S and the other side thereof is in contact with the drain electrode D.

A first insulating layer PAS for protecting an element and a second insulating layer PAC for planarization are sequentially formed on the TFT T. A pixel electrode PXL and a common electrode COM formed of a conductive material are formed on the second insulating layer PAC. The pixel electrode PXL and the common electrode COM are formed on the same layer and formed of the same material.

The pixel electrode PXL is in contact with the drain electrode D through a shared contact hole SRH penetrating through the first insulating layer PAS, the second insulating layer PAC, and the gate insulating layer GI. That is, the pixel electrode PXL is electrically connected to a portion of the drain electrode D exposed through the shared contact hole SRH. The pixel electrode PXL may have a structure of the teeth of a comb in which a plurality of line segment shapes are arranged to be parallel at a predetermined interval within the pixel region. However, a shape of the pixel electrode PXL is not limited thereto.

The common electrode COM is connected to a common line CL extending in a predetermined direction so as not to be electrically connected to the gate line GL. The common line CL is formed of the same material as that of the gate line GL and formed on the same layer as that of the gate line GL. The common electrode COM is in contact with the common line CL via the shared contact hole SRH penetrating through the first insulting layer PAS, the second insulting layer PAC, and the gate insulating layer GI. That is, the common electrode COM is electrically connected to a portion of the common line CL exposed through the shared contact hole SRH. The common electrode COM has a structure of the teeth of a comb in which a plurality of line segment shapes are arranged to be parallel at a predetermined interval within the pixel region. The structure of the teeth of a comb is disposed to be engaged with a structure of the teeth of a comb of the pixel electrode PXL such that both the structures are spaced apart from one another so as not to be in contact with each other. However, the shape of the common electrode COM is not limited thereto.

In the single shared contact hole SRH, channels CH1 and CH2 to which different signals are applied are formed. Here, a channel refers to a single path along which electrodes and/or lines disposed on mutually different layers are connected to receive the same signal. The first channel CH1 in which the drain electrode D and the pixel electrode PXL are electrically connected receives a data voltage. The second channel CH2 in which the common line CL and the common electrode COM are electrically connected receives a common voltage. Since different signals are separately applied to the first channel CH1 and the second channel CH2, the first channel CH1 and the second channel CH2 may be required to be disposed to be spaced apart from one another so as not to be shorted. To this end, in the first embodiment of the present disclosure, the gate insulating layer GI below the drain electrode D is over-etched to generate an undercut. Since the undercut is generated below the drain electrode D, one end of the drain electrode D protrudes, relative to one end of the gate insulating layer GI, within the shared contact hole SRH.

The two channels CH1 and CH2 to which different signals are applied may be formed through the single shared contact hole SRH. Unlike the related art in which one contact hole is formed to form one channel, at least two channels CH1 and CH2 may be formed through the single shared contact hole SRH, and thus, there may be no need to secure a sufficient space for forming a plurality of contact holes. Since a space for forming a contact hole is a non-opening, a sufficient aperture ratio, compared with the related art, may be secured by reducing the non-opening region.

Hereinafter, a method for manufacturing a TFT substrate according to the first embodiment of the present disclosure will be described with reference to FIGS. 6A to 6F. FIGS. 6A to 6F are views illustrating a method for manufacturing a TFT substrate according to the first embodiment of the present disclosure, taken along line II-II' of FIG. 3.

Figure 6A:
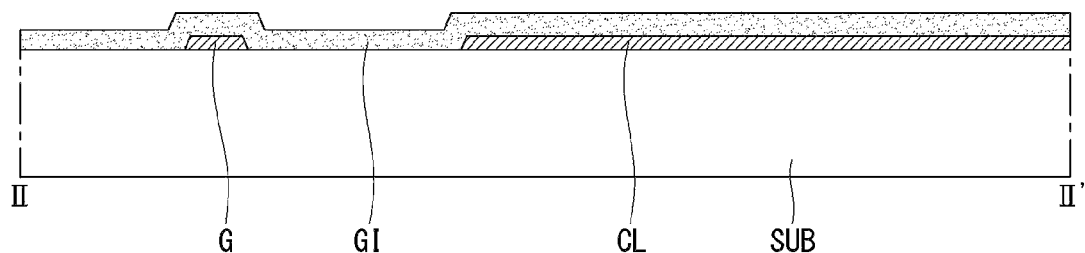
FIGS. 6A to 6F are views illustrating a method for manufacturing a TFT substrate according to the first embodiment of the present disclosure, taken along line II-II' of FIG. 3.

Referring to FIG. 6A, a gate metal material is applied to a substrate SUB and patterned through a mask process to form a gate element. The mask process may be performed according to a known method, and thus, a detailed description thereof will be omitted. The gate element includes a gate electrode G and a common line CL. The gate electrode G is branched from a gate line GL (please refer to FIG. 3) extending in one direction of the substrate SUB. The common line CL is formed to be spaced apart from the gate line GL (please refer to FIG. 3) and the gate electrode G so as not to be in contact therewith. A common voltage is applied to the common line CL. A gate insulating layer GI is applied to the substrate SUB with the gate element formed thereon.

Figure 6B:
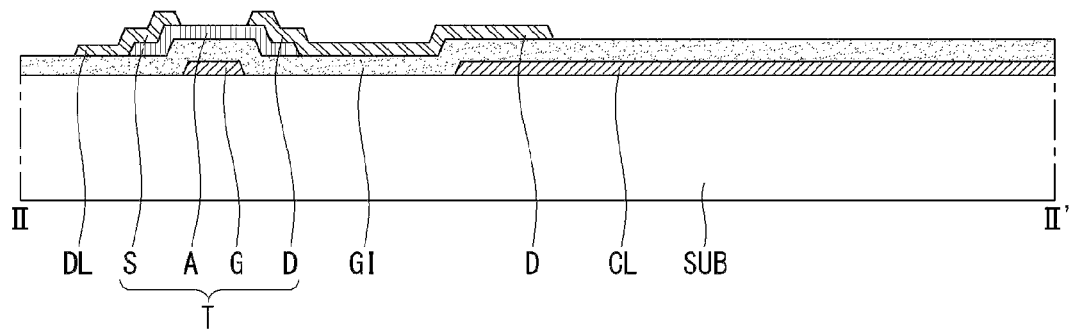

Referring to FIG. 6B, a semiconductor material is applied to the substrate SUB with the gate insulating layer GI formed thereon. The semiconductor material is patterned through a mask process to form a semiconductor layer A overlapping the gate electrode G. A source/drain metal material is deposited on the substrate SUB with the semiconductor layer A formed thereon. The source/drain metal material is patterned through a mask process to form a source electrode S and a drain electrode D. The source electrode S is in contact with one side of the semiconductor layer A, and the drain electrode D is in contact with the other side of the semiconductor layer A. The source electrode S and the drain electrode D are separated from each other and formed to be spaced apart from each other by a predetermined interval. Accordingly, a TFT T having the gate electrode G, the semiconductor layer A, the source electrode S, and the drain electrode D is completed.

Figure 6C:
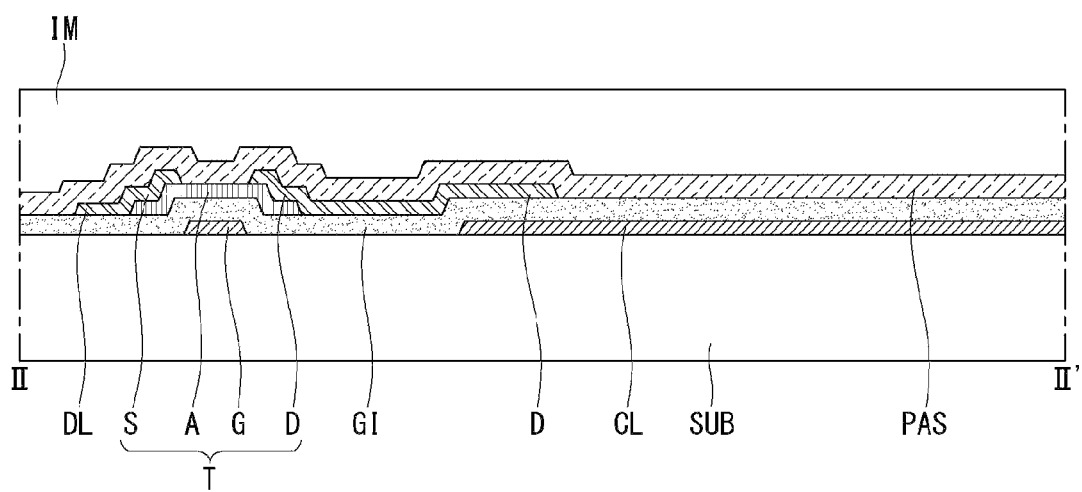

Referring to FIG. 6C, an insulating material is applied to the substrate SUB with the TFT T formed thereon to form a first insulating layer PAS. At this stage, the first insulating layer PAS remains unpatterned. Thereafter, a photosensitive insulating material IM is applied to the substrate with the first insulating layer PAS formed thereon.

Figure 6D:
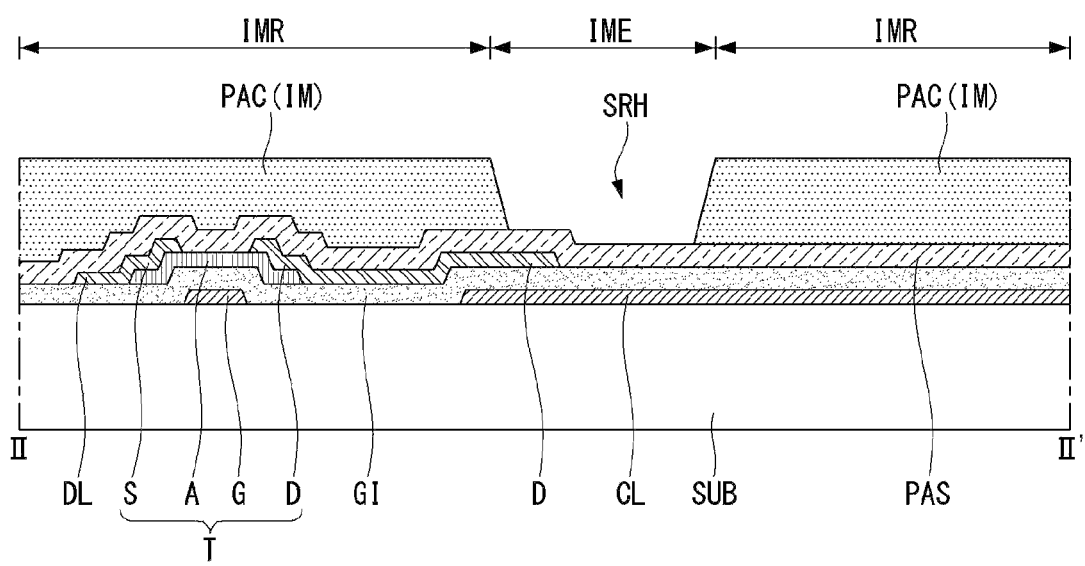
Figure 6E:
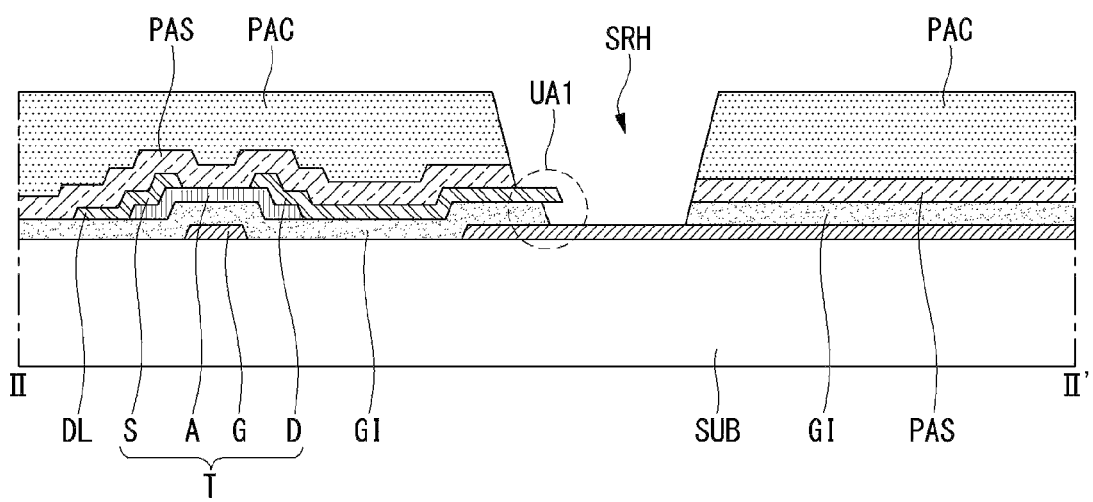

Referring to FIGS. 6D and 6E, a mask (not shown) is prepared in order to pattern the photosensitive insulating material IM through a mask process. Light is selectively applied to the photosensitive insulating material IM through the prepared mask. The photosensitive insulating material IM may be a positive type photoresist material or may be a negative type photoresist material. Hereinafter, a case in which the photosensitive insulating material IM is a positive type photoresist material will be described as an example.

When the photosensitive insulating material IM exposed through the mask is developed, the photosensitive insulating material IM of a region IME to which light was irradiated has been removed. The photosensitive insulating material IM of a region IMR, to which light was not irradiated, remains. The remaining photosensitive insulating material IM becomes a second insulating layer PAC. A portion of the first insulating layer PAS is exposed through the region IME in which the photosensitive insulating material IM was removed.

The first insulating layer PAS and the gate insulating layer GI are patterned through a mask process using the second insulating layer PAC to form a shared contact hole SRH. A portion of the drain electrode D and a portion of the common line CL are exposed through the shared contact hole SRH. Here, one end of the gate insulating layer GI is over-etched to generate undercut. Since the undercut is generated below the drain electrode D, one end of the drain electrode D protrudes (UA1), relative to one end of the gate insulating layer GI within the shared contact hole SRH.

The undercut is formed through materials having etch selectivity and an over-etch process using these materials. In detail, the gate insulating layer GI includes an insulating material having a significant difference in etch selectivity from a conductive material forming the drain electrode D. Here, the drain electrode D may serve as a mask for patterning the gate insulating layer GI according to the difference in etch selectivity. Thus, as an etching process is performed, one end of the gate insulating layer GI is gradually removed from below the drain electrode D. Thus, in an embodiment of the present disclosure, since the gate insulating layer GI positioned below the drain electrode D is over-etched, an undercut phenomenon that one end of the drain electrode D protrudes toward the inner side of the shared contact hole SRH, relative to one end of the gate insulating layer GI may occur. A level of formation of the undercut may vary depending on a change in conditions of the process. That is, process conditions such as a process time, a type of an etchant, and the like, may be appropriately selected to adjust a level of formation of an undercut.

An insulating material for forming the second insulating layer PAC may have photosensitive characteristics and serve as photoresist during a mask process. The second insulating layer PAC, the first insulating layer PAS, and the gate insulating layer GI may be patterned together through a single mask process. Thus, by reducing the number of mask processes when manufacturing a TFT substrate, the process may be simplified and manufacturing time and manufacturing cost may be reduced. Also, a defect incidence rate may be lowered to enhance manufacturing yield. However, the present disclosure is not limited thereto and the second insulating layer PAC, the first insulating layer PAS, and the gate insulating layer GI may be patterned through separate mask processes.

Figure 6F:
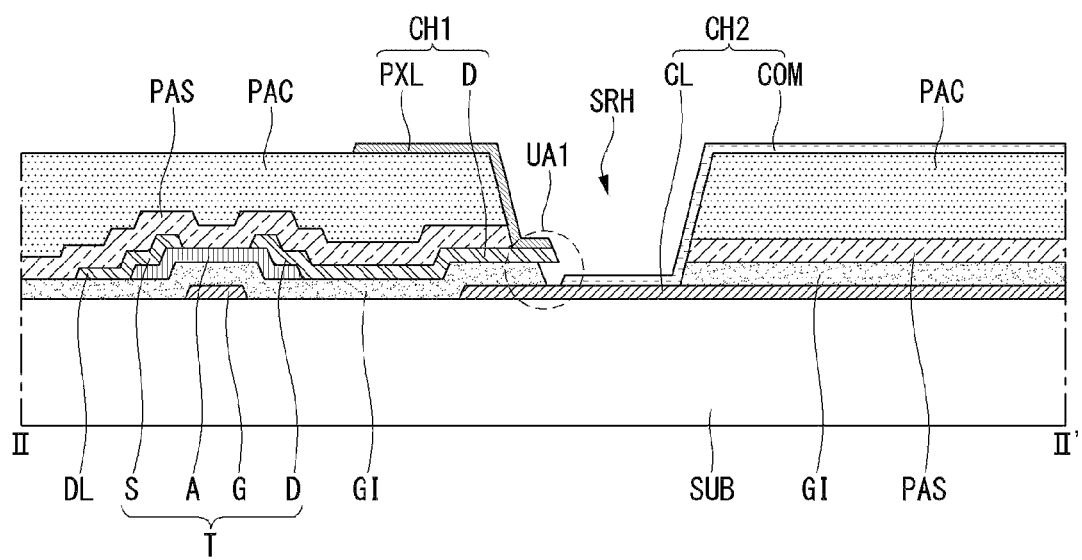

Referring to FIG. 6F, a conductive material is applied to the substrate SUB with the second insulating layer PAC formed thereon. The conductive material is patterned through a mask process to form a pixel electrode PXL and a common electrode COM. The conductive material is divided within the shared contact hole SRH without an additional process. Since the undercut structure that is generated through over-etching result in a step coverage defect, the conductive material is electrically open in the corresponding region UA1. Accordingly, the conductive material is divided into two channels CH1 and CH2 to which different signals are applied.

A portion of the divided conductive material in contact with the drain electrode D becomes a pixel electrode PXL. The pixel electrode PXL is electrically connected to the drain electrode D to receive a data voltage. The other portion of the divided conductive material in contact with the common line CL becomes a common electrode COM. The common electrode COM is electrically connected to the common line CL to receive a common voltage.

The number of contact holes provided to electrically connect lines and/or electrodes formed on mutually different layers may be reduced. That is, at least two channels to which different signals are applied may be formed through the single shared contact hole SRH. Accordingly, there may be no need to secure a space for disposing a plurality of contact holes corresponding to non-openings and there may be no need to secure a process marginal region between a plurality of contact holes, enhancing an aperture ratio.

Since the number of contact holes is reduced, compared with the related art, light leakage due to steps resulting from contact holes may be prevented. Also, a disposition space of a black matrix formed in a corresponding position where light leakage occurs may be reduced, obtaining an effect of enhancing an aperture ratio, compared with the related art. Thus, in a high resolution display device having a high pixel-per-inch (PPI) having a single pixel significantly reduced in size, an embodiment of the present disclosure may secure a sufficient aperture ratio by reducing the number of contact holes.

Since the undercut is generated through over-etching, the conductive material may be divided without an additional process. It is considerably difficult to divide a conductive material through a separate process within a limited contact hole area. Since the conductive material is structurally divided without a separate process within the shared contact hole SRH, a degradation of yield due to an additional process, an increase in manufacturing cost, and the like, may be prevented. Or, in order to perform a process of dividing the conductive material within the contact hole, a large contact hole area may be required. By structurally dividing the conductive material without a separate process within the shared contact hole SRH, an area of the contact hole corresponding to the non-opening area may be minimized.

Second Embodiment

Figure 7:
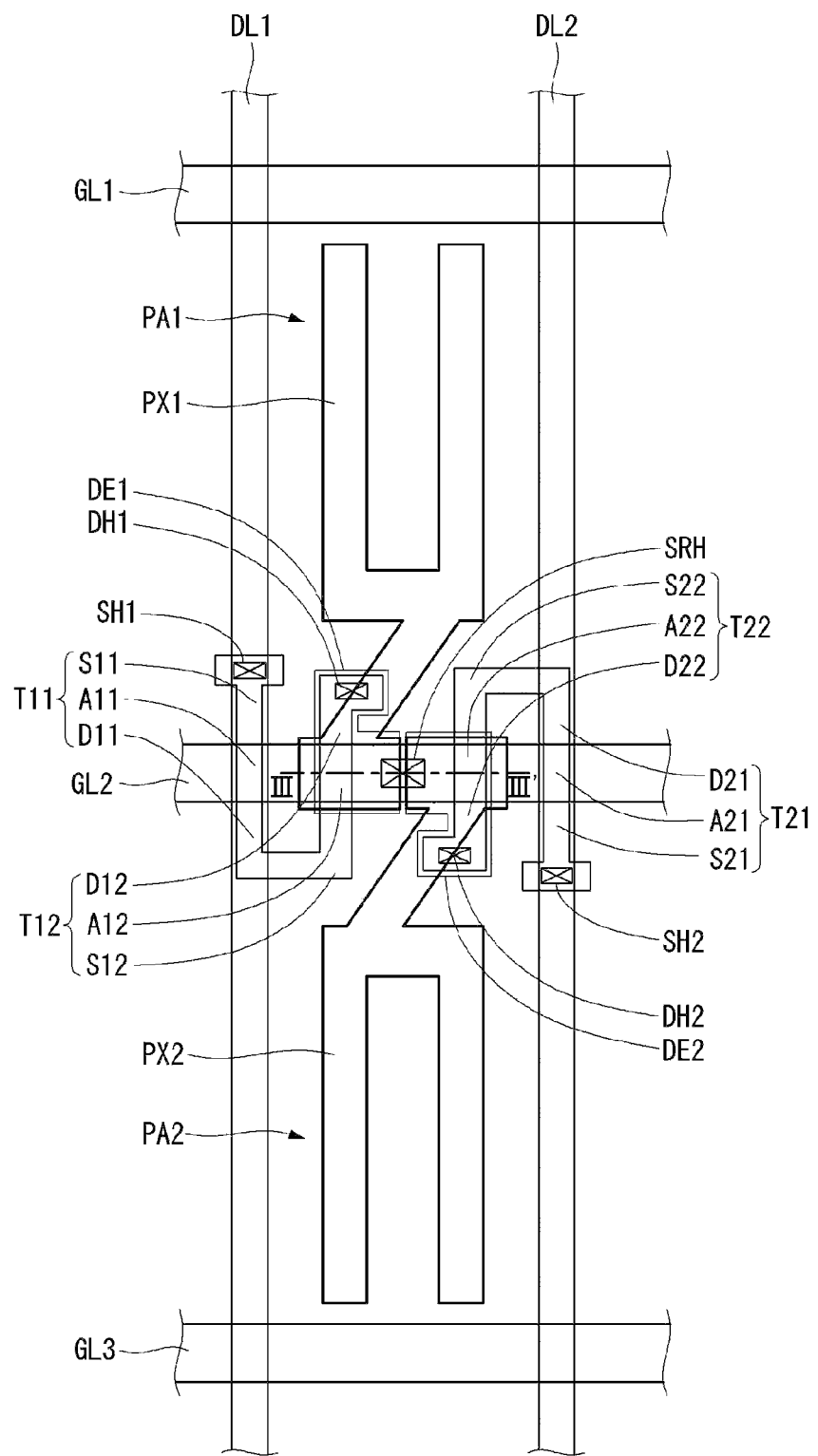
FIG. 7 is a plan view illustrating a structure of a TFT according to a second embodiment of the present disclosure.
Figure 8:
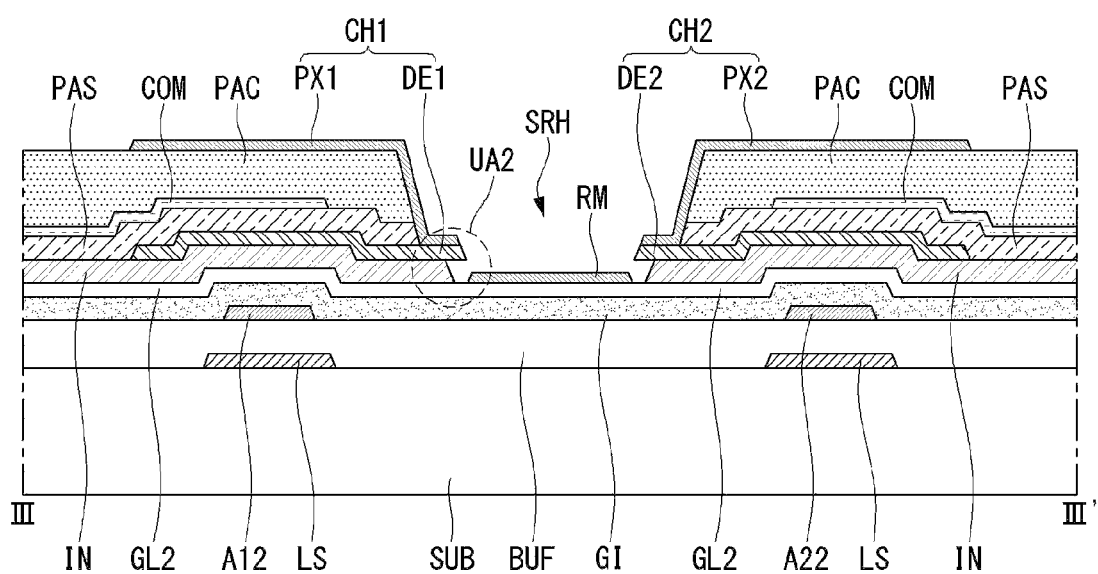
FIG. 8 is a cross-sectional view of the TFT substrate according to the second embodiment of the present disclosure illustrated in FIG. 7, taken along line III-III'.

Hereinafter, a TFT substrate according to a second embodiment of the present disclosure will be described with reference to FIGS. 7 and 8. FIG. 7 is a plan view illustrating a structure of a TFT according to a second embodiment of the present disclosure. FIG. 8 is a cross-sectional view of the TFT substrate according to the second embodiment of the present disclosure illustrated in FIG. 7, taken along line III-III'.

Referring to FIG. 7, the TFT according to the second embodiment of the present disclosure includes a plurality of gate lines GL1, GL2, and GL3 extending in a traverse direction on a substrate SUB and a plurality of data lines DL1 and DL2 extending in a longitudinal direction. The gate lines GL1, GL2, and GL3 and the data lines DL1 and DL2 intersect with each other to define pixel regions PA1 and PA2.

With respect to any one gate line GL2, a pixel region disposed in an upper row is defined as an upper pixel region PA1 and a pixel region disposed in a lower row is defined as a lower pixel region PA2. The data lines DL1 and DL2 may also be divided to be defined as an upper portion and a lower portion with respect to the gate line GL2.

In the gate line GL2 shared by the upper pixel region PA1 and the lower pixel region PA2 adjacent to each other, upper TFTs T11 and T12 allocated to the upper pixel region PA1 and lower TFTs T21 and T22 allocated to the lower pixel region PA2 are disposed. The upper TFTs include an upper compensation TFT T11 and an upper driving TFT T12 connected in series, and the lower TFTs include a lower compensation TFT T21 and a lower driving TFT T22 connected in series. The compensation TFTs T11 and T21, serving to complement OFF-current characteristics, may be omitted.

The upper compensation TFT T11 and the upper driving TFT T12 connected in series may be formed by disposing a semiconductor layer to intersect with the gate line GL twice. Accordingly, the semiconductor layer may have a U shape. The lower compensation TFT T21 and the lower driving TFT T22 connected in series may be formed by disposing a semiconductor layer to intersect with the gate line GL twice. Accordingly, the semiconductor layer may have a ∩ shape.

First, the upper TFTs will be described on the basis of the U-shaped semiconductor layer. The U-shaped semiconductor layer is connected to the upper portion of the first data line DL1 and intersects with the gate line GL2 twice. The U-shaped semiconductor layer intersects with the gate line GL2 for a first time to form a channel region A11 of the upper compensation TFT T11. The U-shaped semiconductor layer intersects with the gate line GL2 for a second time to form a channel region A12 of the upper driving TFT T12.

The ∪-shaped semiconductor layer includes a first source region S11 and a first drain region D11. The first source region S11 is one region connected to the first data line DL1 via an upper source contact hole SH1 and connected to the channel region A11 of the upper compensation TFT T11. The first drain region D11 is the other region connected to the channel region A11 of the upper compensation TFT t11.

Also, the ∪-shaped semiconductor layer includes a second source region S12 and a second drain region D12. The second source region S12 is one region connected to the channel region A12 of the upper driving TFT T12, which extends from the first drain region D11. The second drain region D12 is the other region connected to the channel region A12 of the upper driving TFT T12.

The second drain region D12 is connected to an upper drain electrode DE1 via an upper drain contact hole DH1. Preferably, the upper drain electrode DE1 has a structure extending in a direction toward the gate line GL2 from the upper drain contact hole DH1 in order to prevent a degradation of an aperture ratio.

Next, the lower TFTS will be described on the basis of the ∩-shaped semiconductor layer. The ∩-shaped semiconductor layer is connected to a lower portion of the second data line DL2 and intersects with the gate line GL2 twice. The ∩-shaped semiconductor layer intersects with the gate line GL2 for a first time to form the channel region A21 of the lower compensation TFT T21. The ∩-shaped semiconductor layer intersects with the gate line GL2 for a second time to form the channel region A22 of the lower driving TFT T22.

The ∩-shaped semiconductor layer includes a first source region S21 and a first drain region D21. The first source region S21 is one region connected to the second data line DL2 via a lower source contact hole SH2 and connected to the channel region A21 of the lower compensation TFT T21. The first drain region D21 is the other region connected to the channel region A21 of the lower compensation TFT T21.

Also, the ∩-shaped semiconductor layer includes a second source region S22 and a second drain region D22. The second source S22 is one region connected to the channel region A22 of the lower driving TFT T22, which extends from the first drain region D21. The second drain region D22 is the other region connected to the channel region A22 of the lower driving TFT T22.

The second drain region D22 is connected to a lower drain electrode DE2 via a lower drain contact hole DH2. Preferably, the lower drain electrode DE2 has a structure extending in a direction toward the gate line GL2 from the lower drain contact hole DH2 in order to prevent a degradation of an aperture ratio.

In this manner, the upper TFTs T11 and T12 and the lower TFTs T21 and T22 are completed. The upper driving TFT T12 is connected to the upper pixel electrode PX1 via the shared contact hole SRH. The lower driving TFT T22 is connected to the lower pixel electrode PX2 via the shared contact hole SRH. In detail, via the single shared contact hole SRH, the upper drain electrode DE1 is in contact with the upper pixel electrode PX1 and the lower drain electrode DE2 is in contact with the lower pixel electrode PX2. The first channel CH1 in which the upper drain electrode DE1 and the upper pixel electrode PX1 are electrically connected receives a first data voltage. The second channel CH2 in which the lower drain electrode DE2 and the lower pixel electrode PX2 are electrically connected receives a second data voltage.

Although not shown, the common electrode may be formed to cover the greater part of the entire area of the substrate SUB. Here, the common electrode in the form of a plane electrode may have a structure occupying the greater part of the upper pixel region PA1 and the lower pixel region PA2. As a result, the common electrode and the upper pixel electrode PX1, and the common electrode and the lower pixel electrode PX2 overlap each other with an insulating layer interposed therebetween, forming an in-plane field based on a fringe field.

Referring further to FIG. 8, a light blocking layer LS is formed on the substrate SUB. The light blocking layer LS may be formed to prevent a problem that a semiconductor element is degraded by light such as backlight introduced from a lower side of the substrate SUB. Preferably, the light blocking layer LS is formed in a region in which channel regions A12 and A22 of the TFT overlap each other. A buffer layer BUF is formed on the entire surface of the substrate with the light blocking layer LS formed thereon.

A semiconductor layer is formed on the buffer layer BUF. A gate insulating layer GI and a gate line GL2 are disposed on the entire surface of the substrate SUB with the semiconductor layer formed thereon. The gate line GL2 may intersect with two regions of the semiconductor layer.

The semiconductor layer may be divided into a region overlapping the gate insulating layer GI and the gate line GL2 and a region not overlapping the gate insulating layer GI and the gate line GL2. Regions of the semiconductor layer overlapping the gate line GL2 are defined as the channel regions A12 and A22.

An intermediate insulating layer IN is formed on the gate line GL2. The data line DL1 and the drain electrodes DE1 and DE2 are formed on the intermediate insulating layer IN. A portion of the data line DL1 is utilized as a source electrode. A first insulating layer PAS is formed to cover the data line DL1, the upper drain electrode DE1, and the lower drain electrode DE2. A common electrode COM is formed on the first insulating layer PAS. The common electrode COM may have an area as large as possible to lower sheet resistance and shield electrical interference with various electrodes and lines.

A second insulating layer PAC is formed to cover the common electrode COM. A shared contact hole SRH is formed on the second insulating layer PAC, the first insulating layer PAS, and the intermediate insulating layer IN such that a portion of the upper drain electrode DE1, a portion of the lower drain electrode DE2, and a portion of the gate line GL2 are exposed. An upper pixel electrode PX1 and a lower pixel electrode PX2 are formed on the second insulating layer PAC. The upper pixel electrode PX1 is in contact with the upper drain electrode DE1 via the shared contact hole SRH. The lower pixel electrode PX2 is in contact with the lower drain electrode DE2 via the shared contact hole SRH.

The upper pixel electrode PX1 and the lower pixel electrode PX2 are formed of the same material and formed on the same layer. A portion RM of a conductive material forming the upper pixel electrode PX1 and the lower pixel electrode PX2, which is separated from the upper pixel electrode PX1 and the lower pixel electrode PX2, remains on the gate line GL2. A separated portion of the conductive material, which is electrically in contact with the upper drain electrode DE1, becomes the upper pixel electrode PX1. The upper pixel electrode PX1 is electrically connected to the upper drain electrode DE1 to receive a first data voltage. Another separated portion of the conductive material, which is electrically in contact with the lower drain electrode DE2 becomes the lower pixel electrode PX2. The lower pixel electrode PX2 is electrically connected to the lower drain electrode DE2 to receive a second data voltage. The first data voltage and the second data voltage are mutually different signals.

In order to form a fringe field between the common electrode COM and the upper pixel electrode PX1 and between the common electrode COM and the lower pixel electrode PX2, the upper pixel electrode PX1 and the lower pixel electrode PX2 may be formed as a plurality of segment forms. However, the present disclosure is not limited thereto.

In the single shared contact hole SRH, the channels CH1 and CH2 to which different signals are applied are formed. The first channel CH1 in which the upper drain electrode DE1 and the upper pixel electrode PX1 are electrically connected receives a first data voltage. The second channel CH2 in which the lower drain electrode DE2 and the lower pixel electrode PX2 are electrically connected receives a second data voltage. Since different signals are separately applied to the first channel CH1 and the second channel CH2, the first channel CH1 and the second channel CH2 may be required to be disposed to be spaced apart from one another so as not to be shorted. To this end, in the second embodiment of the present disclosure, the intermediate insulating layer IN below the upper drain electrode DE1 and the lower drain electrode DE2 are over-etched to generate undercut. Since the undercut is generated below the upper drain electrode DE1 and the lower drain electrode DE2, one end of the upper drain electrode DE1 and one end of the lower drain electrode DE2 protrude, relative to the intermediate insulating layer IN, within the shared contact hole SRH.

At least two channels CH1 and CH2, to which different signals are applied, may be formed through the single shared contact hole SRH. Unlike the related art in which one contact hole is formed to form one channel at least two channels CH1 and CH2 are formed through the single shared contact hole SRH, and thus, there may be no need to secure a sufficient space to form a plurality of contact holes. Since a space for forming a contact hole is a non-opening, a sufficient opening region may be secured by reducing the non-opening region, as compared with the related art.

Figure 9A:
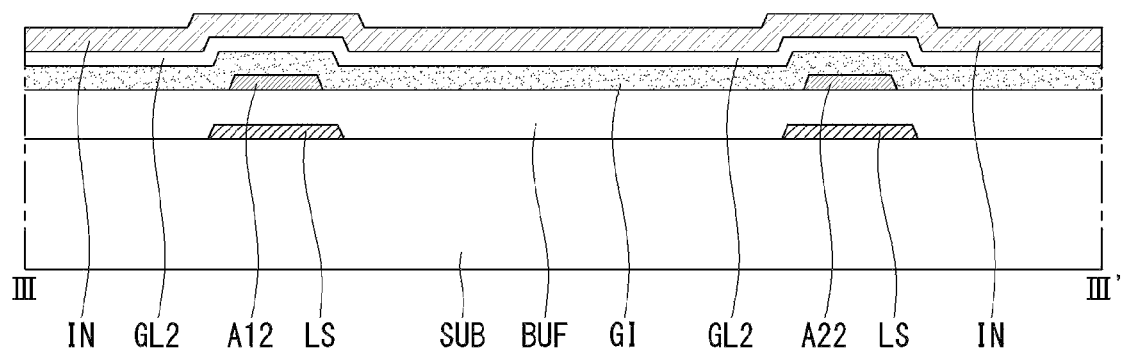
FIGS. 9A to 9E are views illustrating a method for manufacturing a TFT substrate according to the second embodiment of the present disclosure, taken along line III-III' of FIG. 7.

Hereinafter, a method for manufacturing a TFT substrate according to the second embodiment of the present disclosure will be described with reference to FIGS. 9A and 9E. FIGS. 9A to 9E are views illustrating a method for manufacturing a TFT substrate according to the second embodiment of the present disclosure, taken along line III-III' of FIG. 7.

Referring to FIG. 9A, a light blocking material having excellent light blocking performance is applied to a substrate SUB. The light blocking material is patterned through a mask process to form a light blocking layer LS. An insulating material is applied to the entire surface of the substrate SUB with the light blocking layer LS formed thereon to form a buffer layer BUF. A semiconductor material is applied to the entire surface of the substrate SUB with the buffer layer BUF formed thereon. The semiconductor material is patterned through a mask process to form a semiconductor layer. The semiconductor material may include an oxide semiconductor material such as indium gallium zinc oxide (IGZO). Semiconductor layer regions overlapping the gate line GL2 formed thereafter is defined as the channel regions A12 and A22. A gate insulating layer GI and a gate line GL2 are sequentially formed on the entire surface of the substrate SUB with the semiconductor layer formed thereon.

The gate insulating layer GI and the gate line GL2 may be patterned using a single mask. An insulating material is applied to the entire surface of the substrate SUB with the gate line GL2 formed thereon to form an intermediate insulating layer IN.

Figure 9B:
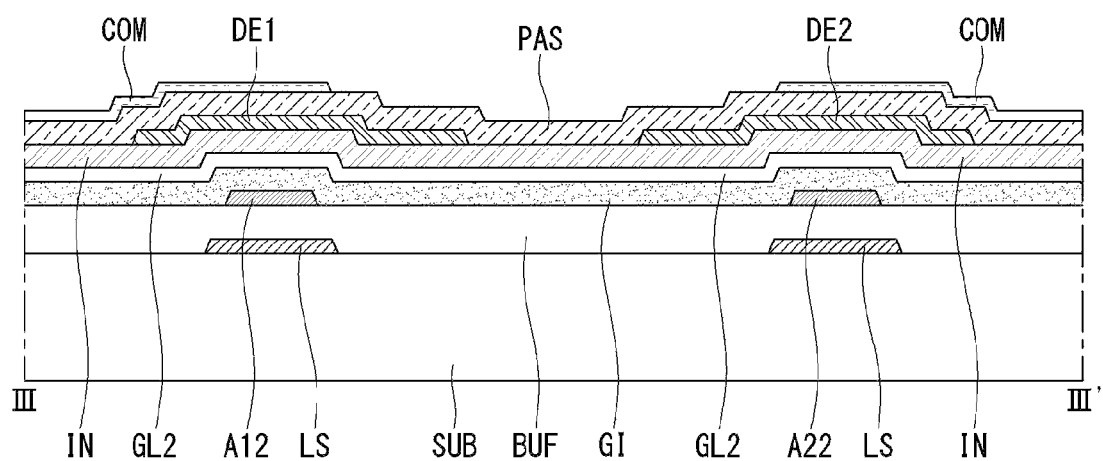

Referring to FIG. 9B, a conductive material is applied to the entire surface of the substrate SUB with the intermediate insulating layer IN formed thereon. The conductive material is patterned through a mask process to form a data line DL1, an upper drain electrode DE1, and a lower drain electrode DE2. The upper drain electrode DE1 is connected to the second drain region D12 of the upper driving TFT via the upper drain contact hole DH1. The lower drain electrode DE2 is connected to the second drain region D22 of the lower driving TFT via the lower drain contact hole DH2. An insulating material is applied to the entire surface of the substrate SUB with the data electrode and the drain electrodes DE1 and DE2 formed thereon to form a first insulating layer PAS. A conductive material is applied to the first insulating layer PAS. The conductive material is patterned through a mask process to form a common electrode COM.

Figure 9C:
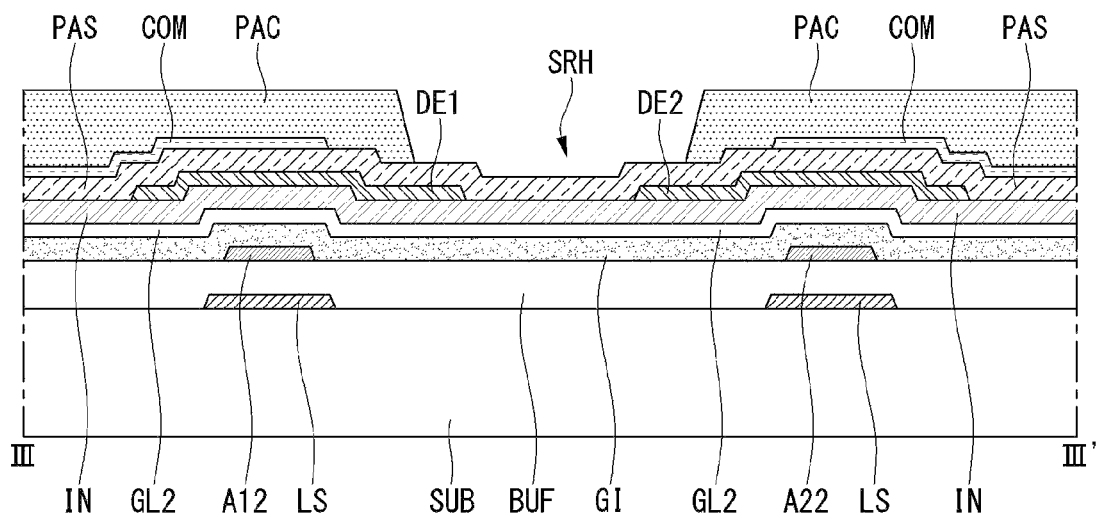

Referring to FIG. 9C, a photosensitive insulating material is applied to the entire surface of the substrate SUB with the common electrode COM formed thereon. When the photosensitive insulating material exposed through a mask is developed, a photosensitive insulating material of a region to which light was irradiated has been removed. A photosensitive insulating material of a region to which light was not irradiated remains. The remaining photosensitive insulating material becomes a second insulating layer PAC. A portion of the first insulating layer PAS is exposed through the region from which the photosensitive insulating material was removed.

Figure 9D:
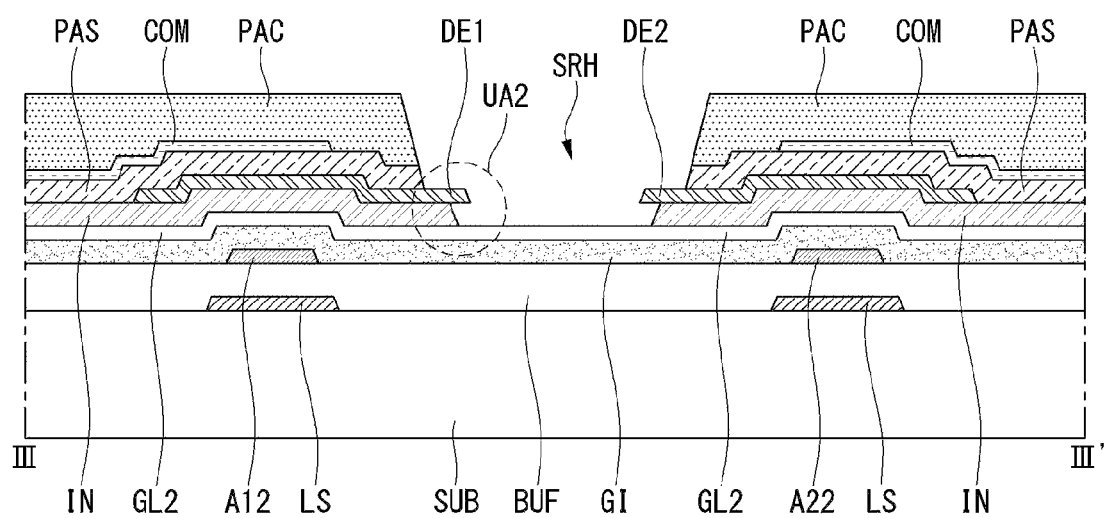
Figure 9E:
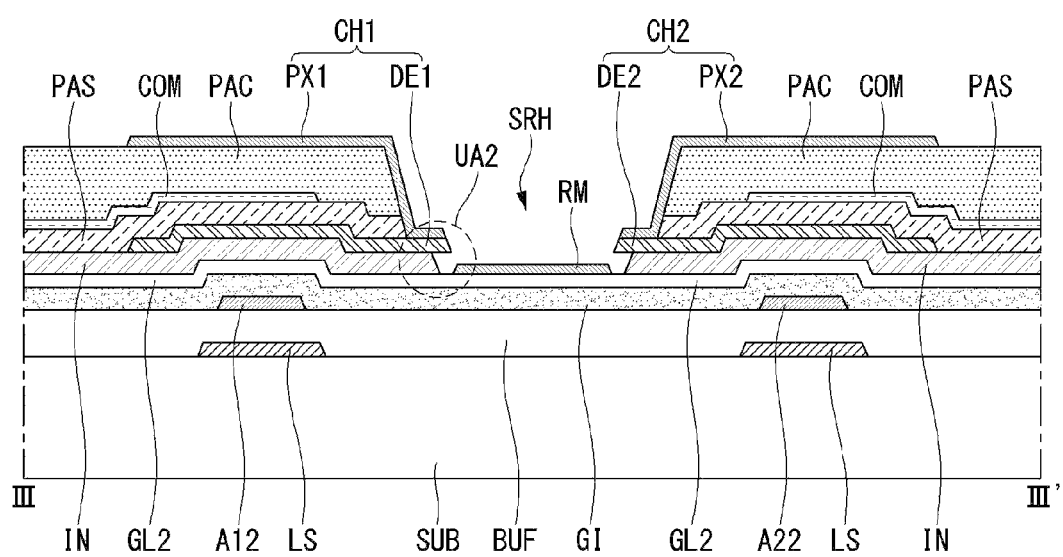

Referring to FIG. 9D, the first insulating layer PAS and the intermediate insulating layer 1N are patterned through a mask process using the second insulating layer PAC to form a shared contact hole SRH. A portion of the upper drain electrode DE1, a portion of the lower drain electrode DE2, and a portion of the gate line GL23 are exposed through the shared contact hole SRH. Here, one end of the intermediate insulating layer IN is over-etched to generate undercut. Since the undercut is generated below the upper drain electrode DE1 and the lower drain electrode DE2, one end of the upper drain electrode DE1 and one end of the lower drain electrode DE2 protrude, relative to one end of the intermediate insulating layer IN, within the shared contact hole SRH.

An insulating material for forming the second insulating layer PAC has photosensitive characteristics and may serve as photoresist during a mask process. The second insulating layer PAC, the first insulating layer PAS, and the intermediate insulating layer IN may be patterned together through a single mask process. Thus, by reducing the number of mask processes when manufacturing a TFT substrate, the process may be simplified and manufacturing time and manufacturing cost may be reduced. Also, a defect incidence rate may be lowered to enhance manufacturing yield. However, the present disclosure is not limited thereto and the second insulating layer PAC, the first insulating layer PAS, and the intermediate insulating layer IN may be patterned through separate mask processes.

Referring to FIG. 9E, a conductive material is applied to the substrate SUB with the second insulating layer PAC formed thereon. The conductive material is patterned through a mask process to form an upper pixel electrode PX1 and a lower pixel electrode PX2. The conductive material is divided within the shared contact hole SRH without an additional process. Since the undercut is generated through over-etching, a step coverage defect that the conductive material is electrically open in the corresponding region UA2. Accordingly, the conductive material is divided into two channels CH1 and CH2 to which different signals are applied.

A portion of the divided conductive material in contact with the upper drain electrode DE1 becomes an upper pixel electrode PX1. The upper pixel electrode PX1 is electrically connected to the upper drain electrode DE1 to receive a first data voltage. The other portion of the divided conductive material in contact with the lower drain electrode DE2 becomes a lower pixel electrode PX2. The lower pixel electrode PX2 is electrically connected to the lower drain electrode DE2 to receive a second data voltage. A portion RM of a conductive material forming the upper pixel electrode PX1 and the lower pixel electrode PX2, which is separated from the upper pixel electrode PX1 and the lower pixel electrode PX2, remains on the gate line GL2.

The number of contact holes provided to electrically connect lines and/or electrodes formed on mutually different layers may be reduced. That is, at least two channels to which different signals are applied may be formed through the single shared contact hole SRH. Accordingly, there may be no need to secure a space for disposing a plurality of contact holes corresponding to non-openings and there may be no need to secure a process marginal region between a plurality of contact holes, enhancing an aperture ratio.

Since the number of contact holes is reduced, compared with the related art, light leakage due to steps resulting from contact holes may be prevented. Also, a disposition space of a black matrix formed in a corresponding position where light leakage occurs may be reduced, obtaining an effect of enhancing an aperture ratio, compared with the related art. Thus, in a high resolution display device having a high pixel-per-inch (PPI) having a single pixel significantly reduced in size, an embodiment of the present disclosure may secure a sufficient aperture ratio by reducing the number of contact holes.

Since the undercut is generated through over-etching, the conductive material may be divided without an additional process. It is considerably difficult to divide a conductive material through a separate process within a limited contact hole area. Since the conductive material is structurally divided without a separate process within the shared contact hole SRH, a degradation of yield due to an additional process, an increase in manufacturing cost, and the like, may be prevented. Or, in order to perform a process of dividing the conductive material within the contact hole, a large contact hole area may be required. By structurally dividing the conductive material without a separate process within the shared contact hole SRH, an area of the contact hole corresponding to the non-opening area may be minimized.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film transistor substrate comprising:
a first electrode and a second electrode are disposed on different layers with at least one of a plurality of stacked insulating layers interposed therebetween;
wherein the second electrode is directly connected to the first electrode within a shared contact hole; and
a third electrode and a fourth electrode are disposed on different layers with at least one of the plurality of stacked insulating layers interposed therebetween;
wherein the fourth electrode is directly connected to the third electrode within the shared contact hole,
wherein the shared contact hole penetrates through the plurality of stacked insulating layers, and
wherein an insulating layer below at least one of a connection portion in which the first electrode and the second electrode are connected and a connection portion in which the third electrode and the fourth electrode are connected has an undercut structure within the shared contact hole.

2. The thin film transistor substrate of claim 1, wherein
a first signal is applied to the first electrode and the second electrode in contact with each other,
a second signal is applied to the third electrode and the fourth electrode in contact with each other, and
the first signal and the second signal are different signals.

3. The thin film transistor substrate of claim 1, further comprising:
a pixel region in which a pixel electrode connected to a thin film transistor (TFT) and a common electrode to which a common voltage is applied through a common line are disposed,
wherein
the first electrode is a pixel electrode,
the second electrode is a drain electrode of the TFT,
the third electrode is the common line, and
the fourth electrode is the common electrode.

4. The thin film transistor substrate of claim 1, further comprising:
a first pixel region in which a first pixel electrode connected to a first TFT is disposed;
a second pixel region in which a second pixel electrode connected to a second TFT is disposed; and
a common electrode connected to the first and second pixel regions and supplying a common voltage to the first and second pixel regions,
wherein
the first electrode is the first pixel electrode,
the second electrode is a drain electrode of the first TFT,
the third electrode is the second pixel electrode, and
the fourth electrode is a drain electrode of the second TFT.

5. The thin film transistor substrate of claim 1, wherein the second electrode includes a portion protruding inward of the shared contact hole, and
wherein the portion of the second electrode is in contact with the first electrode in the shared contact hole.

6. The thin film transistor substrate of claim 5, wherein a portion of the third electrode is exposed through the shared contact hole, and
wherein the forth electrode is in contact with the portion of the third electrode in the shared contact hole.

7. The thin film transistor substrate of claim 1, wherein the first electrode and the fourth electrode include a same material, and
wherein the first electrode and the fourth electrode are separated by the undercut structure in the shared contact hole so that different signals are separately applied to the first electrode and the fourth electrode.

* * * * *